United States Patent
Aggarwal et al.

(10) Patent No.: US 7,514,734 B2
(45) Date of Patent: Apr. 7, 2009

(54) HARDMASK FOR FORMING FERROELECTRIC CAPACITORS IN A SEMICONDUCTOR DEVICE AND METHODS FOR FABRICATING THE SAME

(75) Inventors: Sanjeev Aggarwal, Plano, TX (US); Kelly J. Taylor, Allen, TX (US); Theodore S. Moise, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 199 days.

(21) Appl. No.: 11/220,292

(22) Filed: Sep. 6, 2005

(65) Prior Publication Data
US 2006/0008965 A1    Jan. 12, 2006

Related U.S. Application Data

(62) Division of application No. 10/705,039, filed on Nov. 10, 2003, now Pat. No. 7,001,821.

(51) Int. Cl.
*H01L 29/76* (2006.01)
(52) U.S. Cl. .............. 257/295; 257/310; 257/E21.009; 257/E21.021; 438/3; 438/201; 438/257; 438/593
(58) Field of Classification Search ................ 257/295, 257/310; 438/2, 257, 593
See application file for complete search history.

(56) References Cited

U.S. PATENT DOCUMENTS

| | | | |
|---|---|---|---|
| 5,452,178 A | 9/1995 | Emesh et al. | |
| 5,825,068 A | 10/1998 | Yang | |
| 5,972,722 A | 10/1999 | Visokay et al. | |
| 6,051,858 A | * 4/2000 | Uchida et al. | ............... 257/295 |
| 6,090,697 A | 7/2000 | Xing et al. | |
| 6,144,060 A | 11/2000 | Park et al. | |
| 6,177,351 B1 | 1/2001 | Beratan et al. | |
| 6,225,656 B1 | 5/2001 | Cuchiaro et al. | |
| 6,242,299 B1 | 6/2001 | Hickert | |
| 6,249,014 B1 | 6/2001 | Bailey | |
| 6,261,967 B1 | 7/2001 | Athavale et al. | |
| 6,291,251 B1 | 9/2001 | Nam | |
| 6,423,592 B1 | 7/2002 | Sun | |
| 6,485,988 B2 | 11/2002 | Ma et al. | |
| 6,495,413 B2 | 12/2002 | Sun et al. | |
| 6,528,386 B1 | 3/2003 | Summerfelt et al. | |
| 6,534,809 B2 | 3/2003 | Moise et al. | |
| 6,548,343 B1 | 4/2003 | Summerfelt et al. | |

(Continued)

OTHER PUBLICATIONS

"FeRAM Tutorial", Ali Sheikholeslami and P. Glenn Gulak, A survey of circuit Innovations in Ferroelectric random-access memories, Proceedings of the IEEE, vol. 88, No. 3, May 2000, 3 pages, taken from the Internet at: http://www.eecg.toronto.edu/-ali/ferro/tutorial.html.

(Continued)

*Primary Examiner*—Dung A. Le
(74) *Attorney, Agent, or Firm*—Wade J. Brady III; Frederick J. Telecky, Jr.

(57) ABSTRACT

Hardmasks and fabrication methods are presented for producing ferroelectric capacitors in a semiconductor device, wherein a hardmask comprising aluminum oxide or strontium tantalum oxide is formed above an upper capacitor electrode material, and capacitor electrode and ferroelectric layers are etched to define a ferroelectric capacitor stack.

10 Claims, 9 Drawing Sheets

U.S. PATENT DOCUMENTS

| | | | |
|---|---|---|---|
| 6,576,482 | B1 | 6/2003 | Aggarwal et al. |
| 6,611,014 | B1 | 8/2003 | Kanaya et al. |
| 6,635,528 | B2 | 10/2003 | Gilbert et al. |
| 6,642,100 | B2 | 11/2003 | Yang et al. |
| 6,706,540 | B2 | 3/2004 | Hikosaka et al. |
| 6,781,184 | B2 | 8/2004 | Solayappan et al. |
| 6,876,021 | B2 | 4/2005 | Martin et al. |
| 2001/0034106 | A1 | 10/2001 | Moise et al. |
| 2001/0044205 | A1 | 11/2001 | Gilbert et al. |
| 2002/0006674 | A1* | 1/2002 | Ma et al. ............... 438/3 |
| 2002/0011616 | A1 | 1/2002 | Inoue et al. |
| 2002/0016012 | A1 | 2/2002 | Kronke et al. |
| 2004/0089920 | A1* | 5/2004 | Joshi et al. ............... 257/629 |
| 2004/0232468 | A1* | 11/2004 | Solayappan et al. ......... 257/310 |

OTHER PUBLICATIONS

"A survey of Circuit Innovations in Ferroelectric Random Access Memories", Ali Sheikholeslami and P. Glenn Gulak, Proceedings of the IEEE, vol. 88, No. 5, May 2000, pp. 667-689.

"Generic CVD Reactor", CVD Basics, Daniel M. Dobkin, Dec. 7, 2001, 3 pages, taken from the Internet at: http://www.batnet.com/enigmatics/semiconductor_processing/CVD_Fundamentals/Introdu . . . .

"Physical Vapor Deposition", Cougar Labs, Inc., Dec. 7, 2001, 9 pages, taken from the Internet at: http://www.cougarlabs.com/pvd1.html.

"Parasitic Channel Induced by Spin-On-Glass in a Double-Level Metallization Complimentary Metal Oxide Semiconductor Process", M. Murata, K. Yomauchi, H. Kojima, A. Yokoyama, T. Inoue and T. Iwamori, published in the Journal of Electrochemical Society, vol. 149, No. 8, 1993, pp. 2346-2356.

"Effects of Oxygen Content on Properties of Silicon Oxide Films Prepared at Room Temperature by Sputtering-Type Electron Cyclotron Resonance Plasma", Katsuhiko Furukawa, Yichun Liu, Hiroshi Nakashima, Dawei Gao, Yasuhiro Kashiwazaki, Kiichiro Uchino, Katsunori Muraoka and Hirohisa Tsuzuki, Journal of Applied Physics, vol. 84, No. 8, Oct. 15, 1998, pp. 4579-4584.

Notes taken at the International Symposium on Applications of Ferroelectrics Conference in Nara, Japan in May 2002. The speaker was H. Nagel of Infineon Technologies and Toshiba Corporation, Key Technologies for High Density FeRAM Application, one page.

"The Hydrogen Content of Plasma-Deposited silicon Nitride", W. A. Lanford and M. J. Rand, American Institute of Physics, J. Appl. Phys. 49(4), Apr. 1978, pp. 2473-2477.

"Free Energy Model for the Analysis of Bonding in $a$-$Si_xN_yH_z$ Alloys", Z. Yin and W. Smith, J. Vac. Sci. Technol. A, vol. 9, No. 3, May Jun. 1991, p. 972.

"Comparison Between HCP CVD and PECVD Silicon Nitride for Advanced Interconnect Applications", J. Yota, M. Janani, L.E. Camilletti, A. Kar-Roy, Q.Z. Liu, C. Nguyen, M.D. Woo J. Hander, and P. Van Cleemput, IEEE, 2000, pp. 76-78.

"Hydrogen Role on the Properties of Amorphous Silicon Nitride", F. De Brito Mots, J.F. Justo and A. Fazzio, Journal of Applied Physics, vol. 86, No. 4, Aug. 15, 1999, pp. 1843-1847.

* cited by examiner

HARDMASK FOR FORMING FERROELECTRIC CAPACITORS IN A SEMICONDUCTOR DEVICE AND METHODS FOR FABRICATING THE SAME

RELATED APPLICATION

This application is a divisional of Ser. No. 10/705,039 filed Nov. 10, 2003, now U.S. Pat. No. 7,001,821, which is entitled "Hardmask for Forming Ferroelectric Capacitors in a Semiconductor Device and Methods for Fabricating the Same".

FIELD OF INVENTION

The present invention relates generally to semiconductor devices and more particularly to hardmasks for forming ferroelectric capacitors in a semiconductor device and fabrication methods therefor.

BACKGROUND OF THE INVENTION

Memory is used for storage of data, program code, and/or other information in many electronic products, such as personal computer systems, embedded processor-based systems, video image processing circuits, portable phones, and the like. Memory cells may be provided in the form of a dedicated memory integrated circuit (IC) or may be embedded (included) within a processor or other IC as on-chip memory. Ferroelectric memory, sometimes referred to as "FRAM" or "FERAM", is a non-volatile form of memory commonly organized in single-transistor, single-capacitor (1T1C) or two-transistor, two-capacitor (2T2C) configurations, in which each memory cell includes one or more access transistors. The non-volatility of an FERAM memory cell is the result of the bi-stable characteristic of the ferroelectric material in the cell capacitor(s), wherein the ferroelectric material has multiple stable states.

Ferroelectric memory cells are often fabricated in stand-alone memory integrated circuits (ICs) and/or in logic circuits having on-board non-volatile memory (e.g., microprocessors, DSPs, communications chips, etc.). The ferroelectric memory cells are typically organized in an array, such as folded-bitline, open-bitline, etc., wherein the individual cells are selected by plateline and wordline signals from address decoder circuitry, with the data being read from or written to the cells along bitlines using sense amp circuits. In a typical 1T1C memory cell, a ferroelectric capacitor is coupled between a plateline signal and a source/drain of a MOS cell transistor, the other source/drain is connected to a bitline, and the transistor gate is connected to a wordline control signal to selectively couple the capacitor with the bitline during read and write operations.

The ferroelectric memory arrays are typically constructed in a device wafer along with CMOS logic circuits, wherein the cell transistors are formed concurrently with logic transistors in the device, and the ferroelectric capacitors are constructed in a capacitor layer above the wafer substrate. For example, the construction of the ferroelectric cell capacitors may be integrated into a CMOS fabrication process flow after transistor formation (e.g., after 'front-end' processing), and before the metalization or interconnection processing (e.g., before 'back-end' processing). In a typical integration of ferroelectric capacitors in a CMOS process flow, transistors are formed on/in a semiconductor body, and a poly-metal dielectric (PMD) layer is constructed over the transistors, including tungsten contacts extending through the PMD level dielectric to the gate and source/drain terminals of the transistors. Ferroelectric capacitors are typically constructed in a first inter-level dielectric layer (e.g., ILD0) above the PMD level, wherein interconnection of the capacitors, transistors, and other components (e.g., signal routing) is provided in one or more metalization layers or levels above the ILD0 level.

One difficulty in integrating ferroelectric capacitors into CMOS process flows is the susceptibility of ferroelectric materials to hydrogen related degradation. Many back-end metalization processing steps include hydrogen, for example, in forming trench etch-stop layers, etch clean operations, copper sintering, and other process steps. For unprotected ferroelectric capacitors, such back-end process hydrogen may diffuse into the ferroelectric cell capacitors, causing degradation in the electric properties of the ferroelectric memory cells, including degraded switched polarization. Diffusion barriers may be provided over patterned capacitor stack structures to help reduce migration of hydrogen into the capacitor material layers. However, conventional hardmask structures used in patterning ferroelectric capacitor stacks suffer from cracking during formation of diffusion barrier layers, and may cause hydrogen diffusion paths. Accordingly, there is a need for hardmasks and methods for forming ferroelectric capacitors that can better protect the ferroelectric capacitors from hydrogen in back-end processing.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention. The invention relates to hardmasks and ferroelectric capacitor fabrication techniques, in which an aluminum oxide (e.g., $AlO_x$) or strontium tantalum oxide (e.g., $SrTa_2O_6$) hardmask is formed above an upper capacitor electrode material and the capacitor electrode and ferroelectric layers are etched to define a ferroelectric capacitor stack. The hardmask may also comprise other layers, such as a layer of titanium aluminum nitride or other material having titanium and aluminum content (e.g., TiAlN, TiAl, TiAlON, etc.) or chromium nitride (e.g., CrN) between the upper capacitor electrode and a layer of aluminum oxide or strontium tantalum oxide material. Alternatively, the hardmask comprises a layer of titanium aluminum nitride or other material having titanium and aluminum content (e.g., TiAlN, TiAl, TiAlON, etc.) or chromium nitride (e.g., CrN) between the upper capacitor electrode and a layer of aluminum oxide or strontium tantalum oxide material followed by another layer of titanium aluminum nitride or other material having titanium and aluminum content (e.g., TiAlN, TiAl, TiAlON, etc.) or chromium nitride (CrN), (e.g., TiAlN/AlOx/TiAlN/Ir/IrOx/PZT/Ir/TiAlN).

In accordance with an aspect of the invention, a hardmask structure is provided for forming a ferroelectric capacitor in a semiconductor device. The hardmask structure comprises an aluminum oxide material disposed above an upper electrode material. The aluminum oxide can be deposited and then patterned to cover a portion of the upper electrode material where a ferroelectric capacitor is to be formed. The hardmask structure may comprise any type of aluminum oxide material having both aluminum and oxygen content of any relative concentrations and stoichiometry, for example amorphous $AlO_x$, where X is about 1 or more and about 2 or less or strontium tantalum oxide ($SrTa_2O_6$). The AlOx and/or $SrTa_2O_6$ can be deposited by PVD or CVD or any variations of these processes such as plasma assisted CVD or PVD, etc., which can be optimized to form amorphous films.

The aluminum oxide or strontium tantalum oxide ($SrTa_2O_6$) can be used alone as a hardmask or can be combined with other materials, for example, a titanium aluminum nitride or other material having titanium and aluminum content (e.g., TiAlN, TiAl, TiAlON, etc.) or chromium nitride (e.g., CrN) between the aluminum oxide the upper electrode material. The $AlO_X$ (e.g., or strontium tantalum oxide) or the optional TiAlN hardmask materials may be formed directly over the upper capacitor electrode material or one or more intervening layers may be formed between the hardmask and the upper electrode.

Another aspect of the invention provides methods for fabricating ferroelectric capacitors in a semiconductor device. The methods comprise forming a lower electrode material above a first contact, forming a ferroelectric material above the lower electrode material, and forming an upper electrode material above the ferroelectric material. A hardmask is then formed above the upper electrode material, which comprises aluminum oxide. The ferroelectric capacitor stack structure is then patterned by etching portions of the upper electrode material, the ferroelectric material, and the lower electrode material using the hardmask.

In one example, the lower electrode material is formed by depositing a first layer of iridium (Ir) and a first layer of iridium oxide (IrO) above the first contact, and a lead zirconate titanate (PZT) or other ferroelectric material (e.g., strontium bismuth tantalate (SBT), or other) is formed over the lower electrode. The upper electrode is formed by depositing a second layer of iridium oxide and a second layer of iridium above the ferroelectric material. It is noted that the choice of electrodes may depend on the choice of ferroelectric material. For example, Pt electrodes could be the preferred choice for SBT ferroelectric material and Ir/IrOx could be the preferred choice for PZT ferroelectric. The hardmask is formed by depositing an optional titanium aluminum nitride (TiAlN or other material) layer above the upper electrode material and then depositing an aluminum oxide layer over the titanium aluminum nitride. Alternatively, the hardmask can be formed of a single $AlO_X$ or strontium tantalum oxide ($SrTa_2O_6$) layer over the upper electrode material. A capacitor stack etch mask is formed over the aluminum oxide hardmask layer, and portions of the aluminum oxide layer and the optional titanium aluminum nitride layer are etched using reactive ion etching (RIE) to form the hardmask. The exposed capacitor layers (e.g., the upper electrode material, the ferroelectric material, and the lower electrode material) are then etched by RIE or other techniques to form the ferroelectric capacitor structure, using the aluminum oxide and titanium aluminum nitride as an etch mask. Thereafter, a hydrogen diffusion barrier structure is formed over the ferroelectric capacitor, a dielectric material is formed over the barrier structure, and a second contact is formed through the dielectric material for connection of the upper capacitor electrode in subsequent metalization layers or levels.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
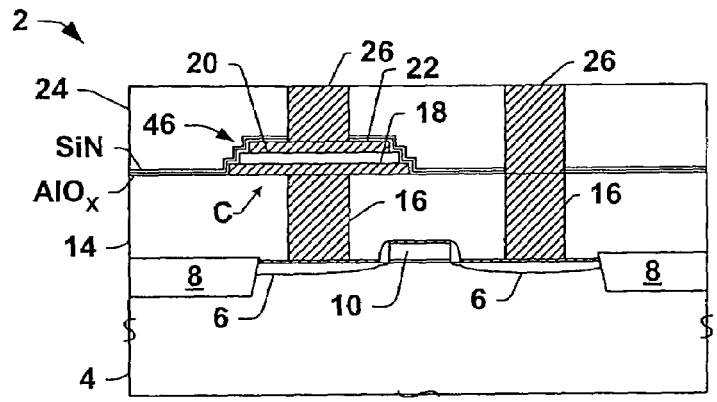
FIG. 1 is a partial side elevation view in section illustrating a portion of a semiconductor device having a ferroelectric capacitor coupled with a MOS transistor to form a 1T1C ferroelectric memory cell.

The present invention will now be described with reference to the attached drawing figures, wherein like reference numerals are used to refer to like elements throughout. The invention relates to semiconductor device fabrication and the use of aluminum oxide hardmasks for patterning ferroelectric capacitor stack structures. The invention may be carried out in any type of semiconductor device, for example, devices having memory cells with ferroelectric cell capacitors or other devices in which ferroelectric capacitors are used. The various aspects and advantages of the invention are hereinafter illustrated and described in conjunction with the drawings, wherein the illustrated structures are not necessarily drawn to scale. FIGS. 1, 2A-2D, 3A, and 3B illustrate capacitor stack fabrication techniques in which undesirable hydrogen diffusion paths result during stack patterning and barrier layer fabrication, and FIGS. 4 and 5A-5M illustrate exemplary implementations of the hardmasks and processing methods of the invention.

Referring initially to FIGS. 1, 2A-2D, 3A, and 3B, a semiconductor device 2 is illustrated having a 1T1C ferroelectric memory cell with a cell transistor formed in/on a silicon substrate 4 and a ferroelectric capacitor C. As shown in FIG. 1, the cell transistor includes a gate structure 10 above a channel region of the substrate 4, with source/drains 6 formed on either side of the channel in an active region located between isolation structures 8. A poly-metal dielectric (PMD) 14 is provided above the substrate 4 to cover the cell transistor, where bitline and plateline contacts 16 are formed through the PMD 14 to connect with the cell transistor source/drains 6 (the electrode of the gate 10 forms a wordline connection in this example). The ferroelectric capacitor C is formed above the plateline source/drain contact 16, including a first or lower electrode 18, a ferroelectric material 20, and a second or upper electrode 22. A sidewall diffusion barrier 46 is formed over the capacitor C, including an aluminum oxide AlO$_X$ material and a silicon nitride material SiN. A first interlevel or inter-layer dielectric (ILD0) 24 is formed over the barrier 46, and conductive contacts 26 are formed through the dielectric 24 (and through the barrier 46) to couple with the upper capacitor electrode 22 (plateline) and with the bitline contact 16 in the PMD level 14.

Figure 2A:
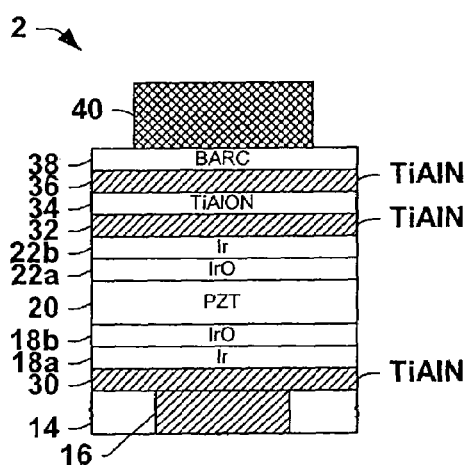
FIGS. 2A-2D are partial side elevation views in section illustrating formation of a ferroelectric capacitor stack in the device of FIG. 1 using a three-layer hardmask that suffers from cracking during fabrication.
Figure 2B:
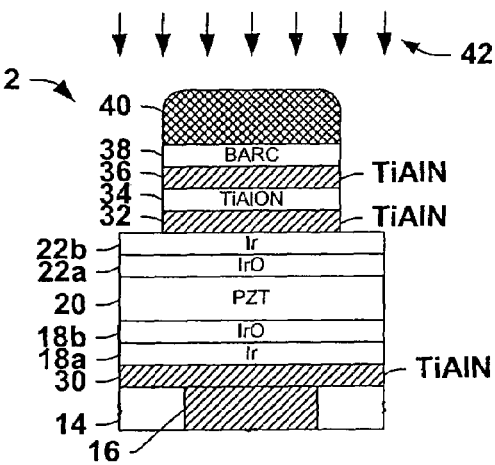
Figure 2C:
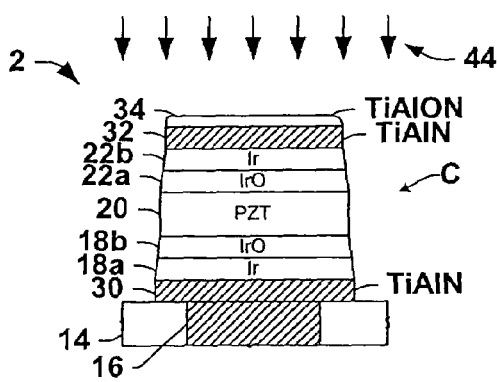
Figure 2D:
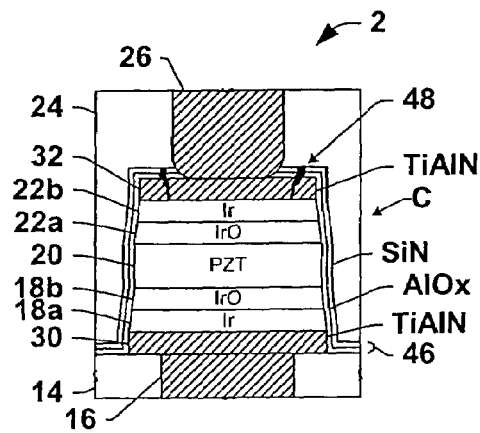
Figure 3A:
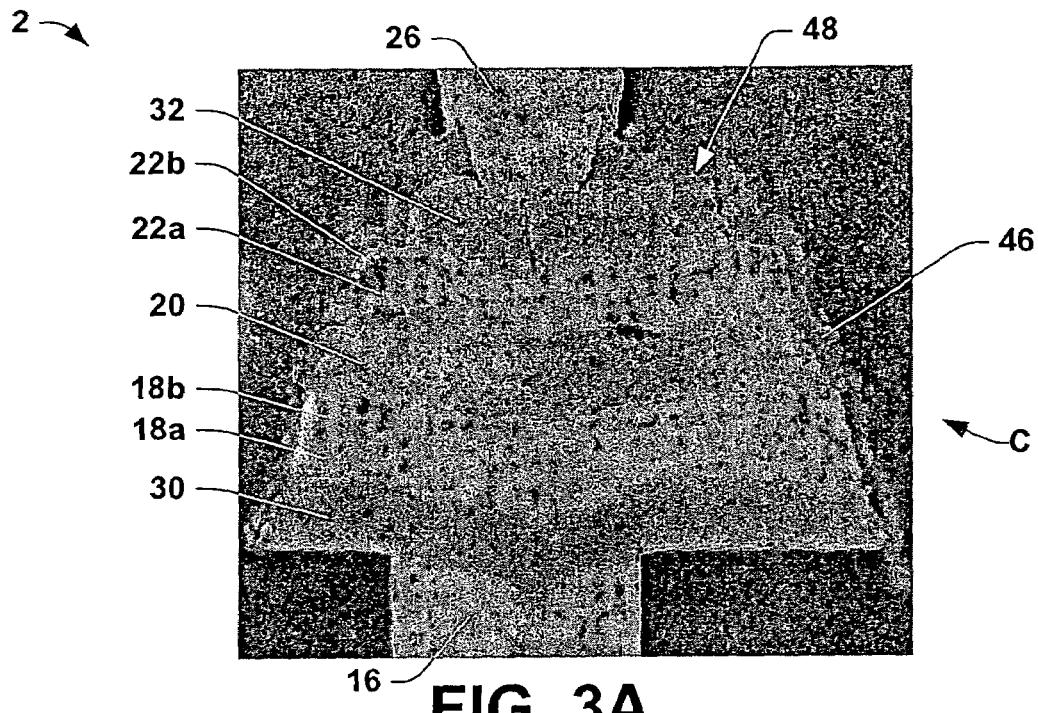
FIGS. 3A and 3B are scanning electron microscope (SEM) images showing sectional side elevation and top plan views of a ferroelectric capacitor stack such as that of FIGS. 1 and 2A-2D having hardmask cracks allowing diffusion of hydrogen into the stack structure during fabrication processing.
Figure 3B:
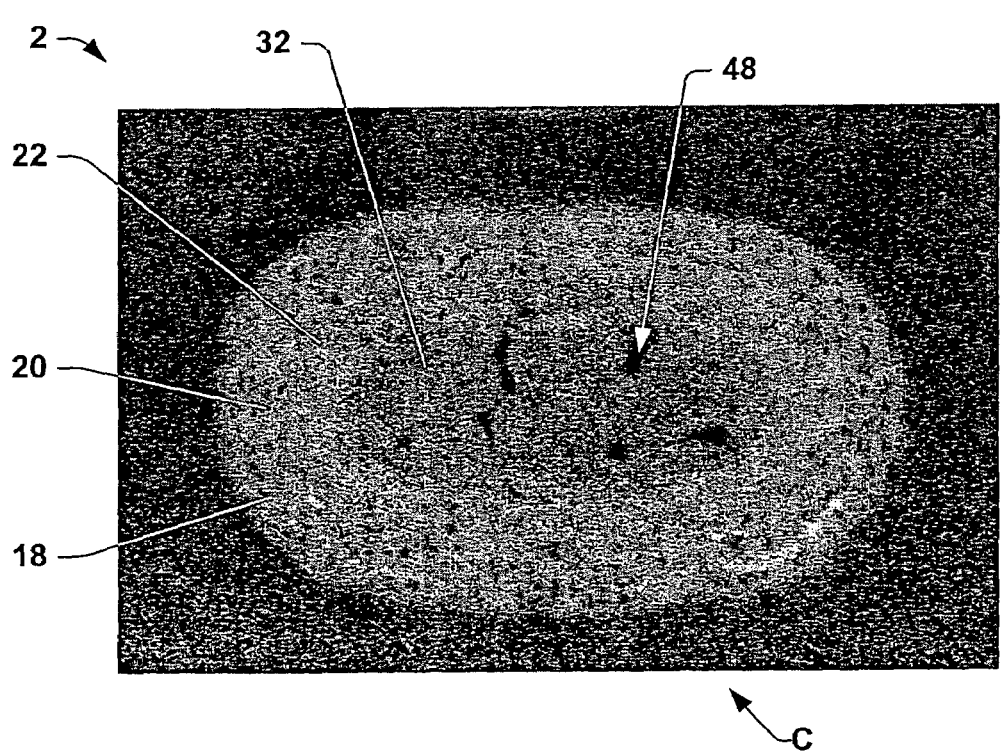

FIGS. 2A-2D illustrate formation of the ferroelectric capacitor stack structure C in the device 2 using a tri-layer hardmask 32, 34, 36 that suffers from cracking during fabrication, wherein FIGS. 3A and 3B are scanning electron microscope (SEM) images showing a ferroelectric capacitor stack C such as that of FIGS. 1 and 2A-2D having hardmask cracks 48. In FIG. 2A, the capacitor and hardmask layers are shown following deposition over the PMD material 14 and over the PMD plateline contact 16. An initial or lower titanium aluminum nitride (TiAlN) layer 30 is deposited over the PMD 14 and over the contact 16, and a bi-layer lower electrode 18 is formed over the TiAlN 30, including an iridium layer (Ir) 18a and an iridium oxide layer (IrO) 18b. A PZT ferroelectric layer 20 is deposited over the lower electrode layer 18b and an upper bi-layer electrode 22 is formed over the ferroelectric 20, including an iridium oxide layer (IrO) 22a and an iridium layer (Ir) 22b.

In the device 2, three hardmask layers 32, 34, and 36 are then deposited over the upper electrode 22, including another TiAlN layer 32, a titanium aluminum oxynitride (TiAlON) layer 34, and an uppermost TiAlN layer 36. A bottom antireflective coating (BARC) layer 38 is then formed over the TiAlN layer 36 to facilitate fabrication of an etch mask 40 above the BARC and upper TiAlN layers 36 and 38 in a prospective capacitor stack location. A hardmask etch 42 is performed in FIG. 2B to pattern the hardmask layers 32-36, and the patterned hardmask 32-36 is then used during a capacitor stack etch 44 in FIG. 2C to define a capacitor stack C, wherein some of the TiAlON 34 and TiAlN 32 may remain after the etch 44. As shown in FIG. 2D, the bi-layer diffusion barrier 46 is formed over the patterned capacitor structure C, and the ILD0 24 and upper electrode contact (VIA0) 26 are formed.

As discussed above, the ferroelectric capacitor C and the ferroelectric material 20 thereof are degraded by exposure to hydrogen during fabrication processing. The inventors have appreciated that ferroelectric films may be severely degraded by exposure to hydrogen in back-end processing found in many CMOS integration schemes. As shown in FIG. 2D and the SEM images of FIGS. 3A and 3B, the inventors have found that the tri-layer hardmask structure 32, 34, and 36 may suffer from cracking in some instances, wherein cracks 48 occur in the TiAlN material 32 remaining over the upper electrode 22 after the capacitor stack etch 44. These cracks 48 leave hydrogen diffusion channels through which process related hydrogen can migrate into the capacitor stack C and degrade or impair device performance (e.g., degraded switched polarization). Thus, although the bi-layer diffusion barrier 46 may operate to inhibit lateral diffusion into the PZT material 20, the upper portion of the stack is subject to hydrogen ingress during subsequent processing. The tri-layer hardmask 32-36 is further problematic in fabrication, due to difficulties in adjusting deposition conditions to transition between formation of TiAlN 32 to TiAlON 34 and back to TiAlN 36, while trying to control the amount of oxygen content in the TiAlON 34 to avoid high resistivity. In this regard, the introduction of oxygen in the formation of the TiAlON 34 presents challenges in uniformly distributing oxygen within a wafer, wherein non-uniformities of 15% are common.

With respect to preventing or inhibiting hydrogen degradation, cracks that occur at or before etching openings through the ILD0 material 24 (e.g., before the VIA0 etch) open hydrogen diffusion channels, leaving the capacitor C prone to hydrogenating process steps. In the example device 2, the bi-layer structure 46 is theoretically intended to prevent hydrogen damage. In particular, the deposition of the AlO$_x$ layer is generally a hydrogen-free process, but the subsequent deposition of the SiN layer is a hydrogenating process. The SiN is used because this material operates both as a hydrogen diffusion barrier and also as an etch-stop layer in performing the VIA0 etch through the ILD0 material 24. However, because the process of depositing the SiN material involves hydrogen, and because SiN may react with the PZT 20 to form lead-silicon and other Si+PZT byproducts, the AlO$_X$ layer is deposited first. The AlO$_X$ layer inhibits hydrogen ingress, while being generally non-reactive with respect to the ferroelectric material.

While not wishing to be tied to any particular theory, the inventors believe that grain boundaries in the TiAlON 34 and/or in the TiAlN 32 of the tri-layer hardmask act as origins of fractures, particularly during formation of the overlying bi-layer hydrogen barrier structure 46, resulting in the cracks 48 (FIGS. 2D, 3A, and 3B). In this regard, it is believed that because the deposited TiAlN 32 is a crystalline film and because the SiN layer is a compressive film, fractures 48 occur in the hardmask near the interface to the TiAlN/Ir during formation of the barrier 46, in particular, during formation of the SiN layer. Cracks 48 also extend into and through the barrier AlO$_X$, because it is relatively thin, resulting in a diffusion path for hydrogen. The cracks 48 are believed to originate at grain boundaries, and depending on the stress changes that the patterned capacitor goes through during processing, the grain boundaries act as crack propagation sites. The formation of the SiN layer is believed to start these fractures as the SiN is a highly compressive film, whereas the AlO$_x$ and the other stack layers are generally tensile films.

As illustrated and described further below, the invention provides capacitor stack etch hardmasks allowing integration of ferroelectric cell capacitor fabrication in conjunction with existing back-end interconnect (e.g., metalization) processing, while reducing or mitigating hydrogen-related ferroelectric degradation in stand-alone or embedded memory products or other devices having ferroelectric capacitors.

Figure 4:
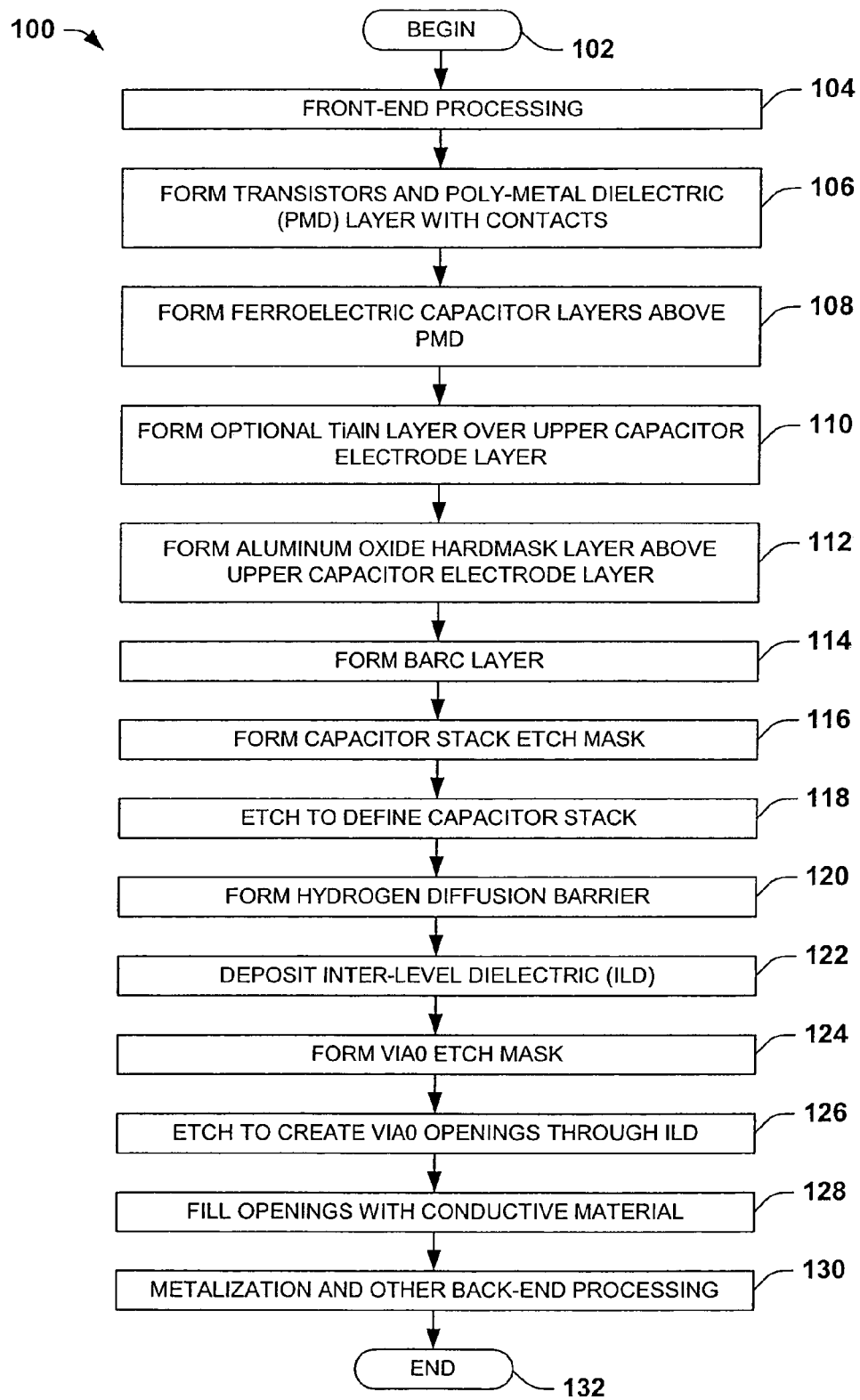
FIG. 4 is a flow diagram illustrating an exemplary method of fabrication semiconductor devices having ferroelectric capacitors in accordance with one or more aspects of the present invention.

Referring now to FIGS. 4 and 5A-5M, the present invention provides a new capacitor etch hardmask structure and methods for fabricating ferroelectric capacitors by which the cracking (cracks 48 in the device 2) can be avoided or mitigated, thereby reducing the likelihood of hydrogen ingress into the ferroelectric capacitor stack structure. FIG. 4 illustrates an exemplary method 100 for fabricating ferroelectric capacitors in a semiconductor device in accordance with the invention, and FIGS. 5A-5M illustrate one such device 202 undergoing fabrication processing. While the method 100 is illustrated in FIG. 4 and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

The methods according to the present invention, moreover, may be implemented in association with the fabrication of devices illustrated and described herein as well as in association with other devices and structures not illustrated. For example, the exemplary method 100 may be employed in fabricating a semiconductor device 202 as illustrated and described below with respect to FIGS. 5A-5M. Also, while the following examples illustrate exemplary ferroelectric capacitors formed using PZT ferroelectric materials, AlOx barrier layers, and Ir/IrO electrode materials, the invention may be employed in association with ferroelectric capacitors fabricated with any suitable ferroelectric and electrode materials. For example, SBT ferroelectric materials may alternatively be employed with AlOx or strontium tantalum oxide ($SrTa_2O_6$) barrier materials. Also, $SrTa_2O_6$ materials may be employed in hardmasks used to form capacitors using PZT or other ferroelectric materials, wherein all such variant implementations are contemplated as falling within the scope of the present invention.

In addition, while the exemplary semiconductor devices are illustrated herein with ferroelectric capacitors formed in a dielectric layer or level after front-end contact formation and prior to formation of overlying metalization levels, the invention may be employed at other points in a fabrication process, for example, wherein the ferroelectric capacitors are formed at any level in a multi-level semiconductor device design. Furthermore, the invention may be employed in semiconductor devices fabricated on or in any type of semiconductor body, including but not limited to silicon substrates, SOI wafers, epitaxial layers formed above a substrate, etc. In this regard, the invention is not limited to the examples illustrated and described herein, and all variant implementations providing aluminum oxide hardmasks are contemplated as falling within the scope of the present invention and the appended claims.

Beginning at 102 in FIG. 4, the method 100 comprises front-end processing at 104, including creating n and p-wells in the semiconductor body and construction of isolation structures (e.g., LOCOS field oxide or STI structures) in field areas of the wafer. At 106, transistors are formed for logic or analog circuitry and for ferroelectric memory cells, and an initial dielectric material is formed over the transistors, referred to herein as a poly-metal dielectric (PMD). Conductive contacts (e.g., tungsten, etc.) are formed through the PMD layer or level for connection to the cell transistor bitline source/drains as well as to the source/drains for connection with subsequently formed ferroelectric capacitors. Any suitable front-end and transistor fabrication processing techniques and materials may be employed at 104 and 106 within the scope of the invention.

At 108, ferroelectric capacitor layers are formed over the PMD and contacts, including formation of upper and lower conductive capacitor electrode layers and a ferroelectric material layer between the electrode layers. Any suitable materials, material thicknesses, and layer formation processes may be employed in forming the ferroelectric capacitor material layers at 108 within the scope of the invention. For example, in the device 202 illustrated and described below with respect to FIGS. 5A-5M, the upper and lower electrodes are both bi-layers comprising iridium and iridium oxide (Ir and IrO), with lead zirconate titanate (PZT) ferroelectric material between the electrodes. It is noted that the choice of electrodes may depend on the choice of ferroelectric material. For example, Pt electrodes could be the preferred choice for SBT ferroelectric material and Ir/IrOx could be the preferred choice for PZT ferroelectric. In the illustrated implementation, a diffusion barrier is first created comprising TiN formed over the PMD dielectric and the PMD tungsten contacts via chemical vapor deposition (CVD) with a TiAlN film or a TiAlON being deposited thereover using a physical vapor deposition (PVD) or other process. The bottom electrode material is then formed over the diffusion barrier, for example, comprising any conductive material such as Ir, $IrO_x$, Pt, Pd, PdOx, IrPt alloys, Au, Ru, $RuO_x$, $(Ba,Sr,Pb)RuO3$, $(Sr,Ba,Pb)IrO3$, Rh, $RhO_x$, $LaSrCoO_x$, $(Ba,Sr)RuO_3$, $LaNiO_3$, etc., or any stack or combination thereof, wherein a first layer of Ir and an overlying IrO layer are used in the illustrated example to form the lower electrode.

Ferroelectric material is deposited over the lower electrode material using any appropriate deposition techniques such as metal organic chemical vapor deposition (MOCVD) using any suitable ferroelectric materials, including but not limited to $Pb(Zr,Ti)O_3$ PZT (lead zirconate titanate), doped PZT with donors (Nb, La, Ta) acceptors (Mn, Co, Fe, Ni, Al) and/or both, PZT doped and alloyed with $SrTiO_3$, $BaTiO_3$ or $CaTiO_3$, strontium bismuth tantalate (SBT) and other layered perovskites such as strontium bismuth niobate tantalate (SBNT) or bismuth titanate, $BaTiO_3$, $PbTiO_3$, $Bi_2TiO_3$, etc. The top electrode is then formed using any material, which may be a single layer or a multi-layer conductive structure such as Ir, $IrO_x$, $RuO_x$, $RhO_x$, $PdO_x$, $PtO_x$, $AgO_x$, $(Ba,Sr)RuO_3$, $LaSrCoO_3$, $LaNiO_3$, $YBa_2Cu_3O_{7-x}$ with a noble metal layer thereover. In the illustrated device 202 below, the upper electrode is a bi-layer comprising an IrO layer formed over the PZT ferroelectric material, and an Ir layer formed over the IrO layer, wherein the electrode and ferroelectric layers may be formed at 108 to any desired thickness in accordance with the invention.

Preferably, a first layer is comprised of iridium oxide (preferably less than 100 nm thick—more preferably less than 50 nm thick) and a second layer is comprised of iridium (preferably less than 100 nm thick—more preferably less than 50 nm thick). In particular it is advantageous for Pb based ferroelectrics to have a conductive oxide top electrode such as IrOx, RuOx, RhOx, PdOx, PtOx, AgOx, $(Ba,Sr)RuO_3$, $LaSrCoO_3$, $LaNiO_3$, $YBa_2Cu_3O_{7-x}$ rather than a pure noble metal so as to minimize degradation due to many opposite state write/read operations (fatigue). Many of the Bi-containing ferroelectrics, such as SBT, can also use noble metal electrodes such as Pt, Pd, Au, Ag, Ir, Rh, and Ru and still retain good fatigue characteristics. If the top electrode is an oxide, it is advantageous to have a noble metal layer above it in order to maintain low contact resistance between the top metal contact and oxide. For example, it is possible that a TiN layer in contact with IrOx might form $TiO_2$, which is insulating, during subsequent thermal processes. For any electrode using an expensive noble metal such as Pt, Ru, Pd, or Ir, it is advantageous, from a cost and integration standpoint, to use as thin of layer as possible. For PZT electrodes, the preferred top electrode stack is comprised of approximately 10 nm Ir deposited by PVD in Ar on approximately 20 nm IrOx deposited by reactive PVD in $Ar+O_2$ on top of the PZT capacitor dielectric. IrOx is preferred to be deposited below 400 C in gas mixtures of between 50% and 80% $O_2$ with the rest argon with a relatively low sputter power and hence slow deposition rate (preferred to be less than 20 nm/min). It is possible to anneal the top electrode prior to deposition of the hardmask in order to control the stress in the top electrode. For example, sputter deposited electrodes will typically be subject to compressive stress while, the stress in annealed electrode will be tensile.

The ferroelectric layers are then patterned at 110-118 through formation of a hardmask and etching to define a ferroelectric capacitor stack structure having any desired size (area) and shape. At 110, an optional titanium aluminum nitride (TiAlN) layer is formed above the upper electrode material. Other materials can alternatively be used at 110, for example, other material having titanium and aluminum content (e.g., TiAlN, TiAl, TiAlON, etc.) or chromium nitride (e.g., CrN). At 112, an aluminum oxide layer (AlO$_X$, where X is about 1 to 2 in this implementation) is formed over the TiAlN (e.g., or directly over the upper electrode in implementations where no TiAlN or other second hardmask layer is used) via PVD or other suitable deposition process. Alternatively, the hardmask can be formed at 112 by depositing SrTa$_X$O$_Y$, where X is about 1.8-2.2 and Y is about 5.4 to 6.6, for example, SrTa$_2$O$_6$. The AlO$_x$ and/or SrTa$_2$O$_6$ can be deposited at 112 by PVD or CVD or any variations of these processes such as plasma assisted CVD or PVD, etc., which can be optimized by selection of the deposition temperature to form amorphous films. For example, amorphous AlO$_x$ can be deposited at temperatures between 200° C. and 600° C. and SrTa2O6 can be deposited at temperatures between 200° C. and 800° C.

Figure 7:
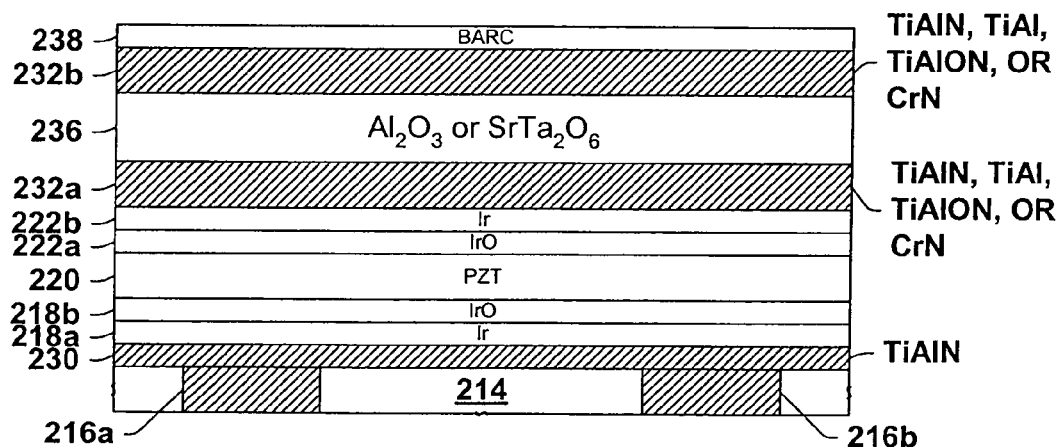
FIG. 7 is a partial side elevation view in section illustrating another possible device having a multi-layer aluminum oxide hardmask in accordance with the invention.

The hardmask layer may alternatively be formed of SrTa$_2$O$_6$ at 112 within the scope of the invention. This aluminum oxide or SrTa$_2$O$_6$ layer (referred to hereinafter as the aluminum oxide layer), together with the optional TiAlN if present, will be patterned and used as a hardmask during capacitor stack etching. Another possible implementation provides a tri-layer hardmask structure, for example, comprising two TiAlN layers with a layer of AlOx or SrTa$_2$O$_6$ therebetween, as illustrated in FIG. 7 below. In the illustrated example, a bottom anti-reflective coating (BARC) material is formed over the aluminum oxide or other hardmask structure at 114 and a mask is formed above the BARC layer at 116, using any suitable photolithographic or other mask formation techniques.

A multi-step etch process is then performed at 118 to define the ferroelectric capacitor stack structure. The inventors have found that the aluminum oxide or SrTa$_2$O$_6$ provides a suitable etch selectivity with respect to both the Ir/IrO electrode materials and with respect to the PZT or other ferroelectric material (e.g., SBT, etc.). In comparison to the tri-layer hardmask in the device 2 above, AlO$_X$ selectivity with respect to Ir and IrO is on par with that of TiAlN and is substantially equivalent to TiAlN and TiAlON with respect to etching PZT. In operation, the thickness of the AlO$_x$ and the etch parameters can be selected such that the capacitor stack can be successfully etched without damaging the upper electrode material. The following Table 1 illustrates etch rate and etch selectivity information for several exemplary reactive ion etch (RIE) processes for etching PZT and Ir at 150 and 350 degrees C., where comparative values are shown for TiAlN and AlO$_X$ hardmasks.

employed within the scope of the invention. The inventors have further appreciated that the aluminum oxide hardmask operates as a hydrogen barrier after etching, which is less susceptible to cracking, and thus protects the capacitor stack (particularly the ferroelectric material thereof) during fabrication processing following the stack etch. Furthermore, using a single aluminum oxide layer (e.g., or aluminum oxide in a bi-layer hardmask with TiAlN) simplifies process integration and film deposition, particularly compared with formation of the tri-layer hardmask (e.g., TiAlN—TiAlON—TiAlN) in the device 2 above.

The etching at 118 first removes uncovered BARC, aluminum oxide, and optional TiAlN to leave a patterned aluminum oxide hardmask. The etch chemistry is then adjusted to selectively remove the uncovered portions of the capacitor material layers (e.g., upper electrode layer(s), then ferroelectric layer(s), then lower electrode layer(s)), wherein the etch chemistry may be adjusted at 118 as each such material layer is removed, until the capacitor stack structure has been defined.

A hydrogen diffusion barrier is then formed at 120 above the patterned ferroelectric capacitor to further prevent or inhibit hydrogen diffusion into the ferroelectric material in subsequent (e.g., back-end) processing of the device, wherein the barrier may be a single layer or a multi-layer structure covering the top and sides of the capacitor stack structure. In the device 202 illustrated below, a first hydrogen barrier layer is formed at 120 over the patterned ferroelectric capacitor structures by depositing aluminum oxide (AlO$_X$) over the patterned ferroelectric capacitor stack using atomic layer deposition (ALD), wherein other deposition techniques and materials may alternatively be used that do not react with the ferroelectric material of the capacitors. A second hydrogen barrier layer is then formed by deposition of silicon nitride (SiN) over the AlO$_X$ layer using plasma-enhanced physical vapor deposition (PECVD) or other suitable deposition processing.

Following formation of the barrier at 120, an inter-level dielectric (e.g., ILD0) is deposited at 122, which is then patterned using a mask at 124 and etched at 126 (e.g., VIA0 etch) to form via/contact openings for electrical coupling to the upper ferroelectric capacitor electrode and to the previously formed bitline contacts in the underlying initial PMD layer. The openings are then filled with conductive material (e.g., copper, aluminum, tungsten, or other conductive material) at 128 to form the bitline and capacitor contacts in the ILD0 layer (e.g., in the capacitor level). Thereafter, further metalization and other back-end processing is performed at

TABLE 1

| layer type, RIE chemistry | Temp (degrees C.) | layer etch rate (Å/s) | TiAlN etch rate (Å/s) | AlO$_X$ etch rate (Å/s) | selectivity layer: TiAlN | selectivity layer: AlO$_X$ |
|---|---|---|---|---|---|---|
| Ir, Cl$_2$/O$_2$ | 350 | 855 | 60 | 52 | 14.3 | 16.4 |
| PZT, Cl/CHF$_3$ | 350 | 580 | 227 | 386 | 2.6 | 1.5 |
| Ir, CO/Cl$_2$/O$_2$ | 350 | 795 | | 48 | | 16.6 |
| PZT, Ar/BCl$_3$ | 350 | 1171 | | 563 | | 2.1 |
| PZT, Cl$_2$/BCl$_3$ | 350 | | | 680 | | 0.0 |
| Ir, Cl$_2$/O$_2$ | 150 | 987 | | 65 | | 15.2 |
| PZT, Cl/CHF$_3$ | 150 | 580 | | 386 | | 1.5 |
| Ir, CO/Cl$_2$/O$_2$ | 150 | 654 | | 60 | | 10.9 |

As can be seen in Table 1, the use of aluminum oxide (e.g., Al$_2$O$_3$ or stoichiometric variations thereof) provides a suitable hardmask for etching the capacitor stack, wherein these etch processes or other processes and etch chemistries can be 130 before the method 100 ends at 132, wherein any number of interconnect (e.g., metalization) layers or levels may be formed. As one possible variation, the formation of the optional TiAlN at 110 can be omitted, wherein etching the contact openings through the ILD dielectric at 126 may be a multi-step process to expose the Ir layer of the upper electrode before filling the openings with tungsten or other conductive material.

Figure 5A:
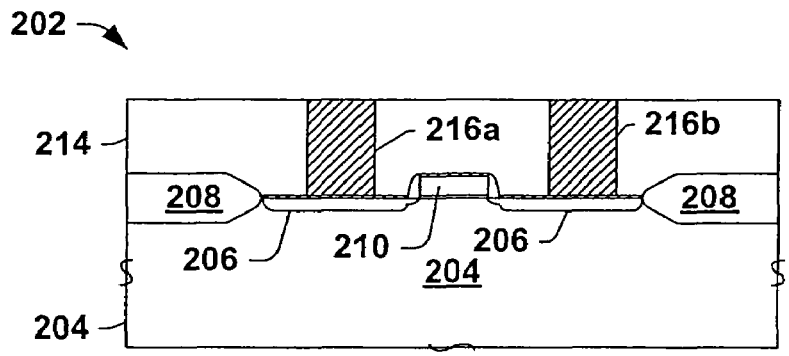
FIGS. 5A-5M are partial side elevation views in section illustrating an exemplary semiconductor device having ferroelectric memory cells at various stages of fabrication using an aluminum oxide hardmask in accordance with the invention.

Referring now to FIGS. 5A-5M, an exemplary semiconductor device 202 is illustrated undergoing fabrication processing according to the present invention, wherein the structures in the device 202 are not necessarily drawn to scale. The device 202 is processed generally according to the method 100 using an aluminum oxide hardmask to pattern a ferroelectric capacitor, although the device 202 and other devices within the scope of the invention may be fabricated using any suitable semiconductor processing techniques. Referring initially to FIG. 5A, the device 202 includes a memory cell transistor having a gate structure 210 above a channel region of a semiconductor body substrate 204, with source/drains 206 formed on either side of the channel between isolation structures 208. A poly-metal dielectric (PMD) 214 is formed above the substrate 204 with PMD plateline and bitline contacts 216a and 216b, respectively, formed through the PMD 214 to connect with the corresponding source/drains 206. The bitline and plateline contacts 216 may be formed of any conductive material (e.g., tungsten, etc.), wherein the gate 210 operates as a conductive wordline connection for the illustrated ferroelectric memory cell.

Figure 5B:
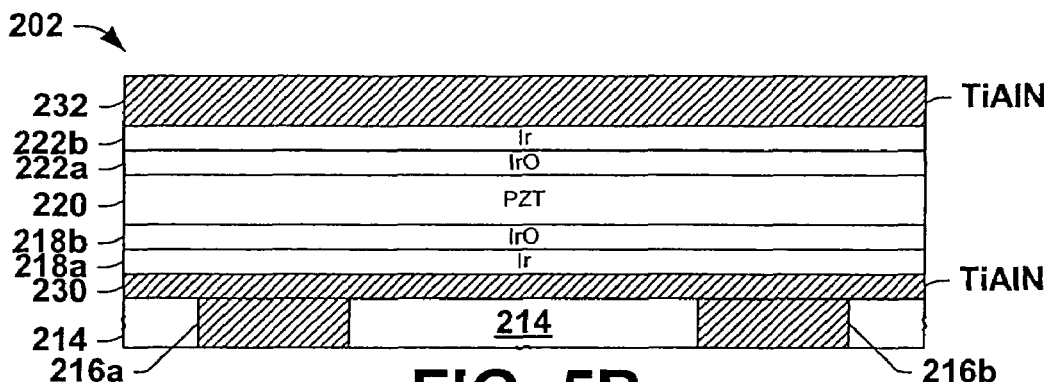
Figure 5C:
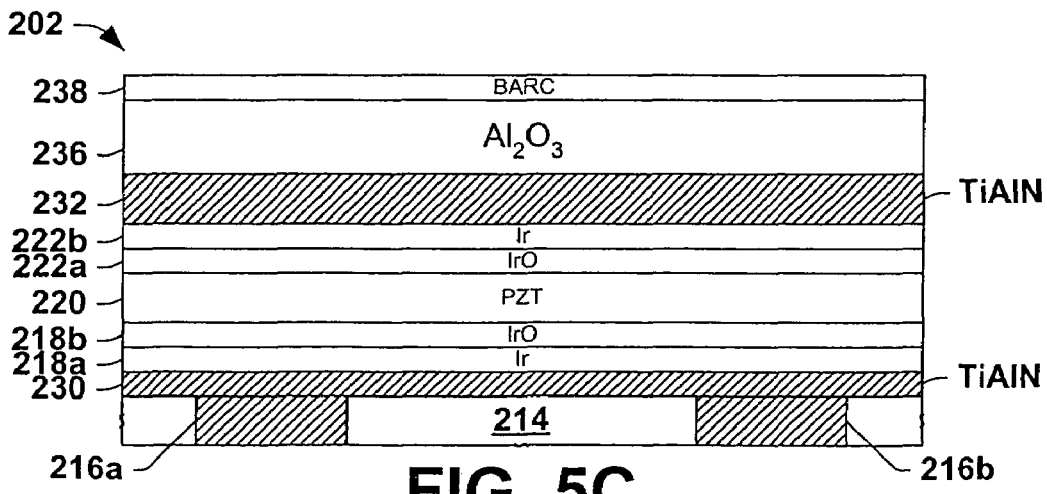

Ferroelectric cell capacitors $C_{FE}$ are then formed over the PMD dielectric layer 214, as illustrated in FIGS. 5B-5F. In FIG. 5B, the capacitor layers are deposited using any suitable materials and deposition process steps, including formation of a lower electrode material, a ferroelectric material, and an upper electrode material, wherein the electrode and ferroelectric materials may individually comprise single or multiple material layers. In the exemplary device 202 in FIG. 5B, an initial titanium aluminum nitride (TiAlN) layer 230 is deposited to a thickness of about 500 Å or more over the PMD 214 and over the contact 216. A bi-layer lower electrode 218 is formed over the TiAlN 230, comprising a first iridium layer (Ir) 218a having a thickness of about 300 Å and a first iridium oxide layer (IrO) 218b having a thickness of about 200 Å. A ferroelectric PZT layer 220 is then deposited over the lower electrode layer 218b to a thickness of about 400 to 1200 Å. An upper bi-layer electrode 222 is formed over the ferroelectric 220, including a second iridium oxide layer 222a (e.g., 200 Å) and a second iridium layer 222b (e.g., 300 Å).

A hardmask is then formed above the upper electrode material 222, including an optional upper TiAlN layer 232 (e.g., about 500 Å or more, which may alternatively be comprised of another material having titanium and aluminum content (e.g., TiAl, TiAlON, etc.) or chromium nitride CrN) above the upper electrode layer 222b, and an $AlO_X$ hardmask layer 236 (e.g., $Al_2O_3$ in FIG. 5C) formed above the TiAlN 232 to a thickness of about 2000 Å. In other possible implementations, the TiAlN 232 may be omitted, with the $Al_2O_3$ being formed above the electrode 222. Also, as discussed above, $SrTa_2O_6$ can be substituted for the aluminum oxide 236 in a single or multi-layer hardmask within the scope of the invention. The AlOx and/or $SrTa_2O_6$ 236 can be deposited by PVD or CVD or any variations of these processes such as plasma assisted CVD or PVD, etc., which can be optimized by selection of the deposition temperature to form amorphous films.

In the illustrated example, hardmask aluminum oxide 236 is amorphous aluminum oxide. The amorphousness of the aluminum oxide hardmask material 236 can be ascertained and/or identified via a transmission electron microscope (TEM) or other suitable device able to detect/identify the presence or absence of crystalline features within the aluminum oxide. Failure of detecting/identifying presence of substantial crystalline features, also referred to as crystallinity, via such a TEM or equivalent device defines the layer as being amorphous within the invention. It is appreciated that other suitable mechanisms can be employed to determine whether or not the aluminum oxide 236 is amorphous. However, it is also appreciated that some mechanisms in certain instances (e.g., x-ray diffraction) can fail to properly define the aluminum oxide 236 as being amorphous. Additionally, it is appreciated that the aluminum oxide 236 can have a percentage of crystalline features (e.g., degrees of amorphousness) and still be sufficiently amorphous in accordance with the present invention.

Figure 6:
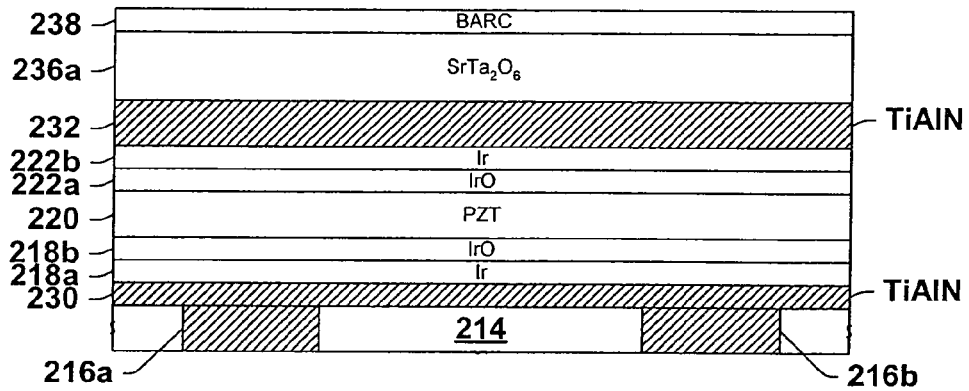
FIG. 6 is a partial side elevation view in section illustrating an alternative device having a strontium tantalum oxide hardmask in accordance with the invention.

A BARC layer 238 is then deposited to any suitable thickness over the hardmask layer 236, where the BARC material operates to facilitate accurate patterning of a subsequent capacitor stack etch mask. Other exemplary alternative hardmasks within the invention are illustrated in FIGS. 6 and 7. In FIG. 6, a device 202a includes a $SrTa_2O_6$ hardmask layer 236a formed over the TiAlN layer 232. In FIG. 7, another possible alternative is illustrated, wherein the hardmask comprises a layer of titanium aluminum nitride 232a (e.g., or other material having titanium and aluminum content, for example, TiAlN, TiAl, TiAlON, etc., or chromium nitride (CrN)) between the upper capacitor electrode 222b and a layer of aluminum oxide or strontium tantalum oxide material 236, followed by another layer 232b of titanium aluminum nitride or other material having titanium and aluminum content (e.g., TiAlN, TiAl, TiAlON, etc.) or chromium nitride (CrN).

Figure 5D:
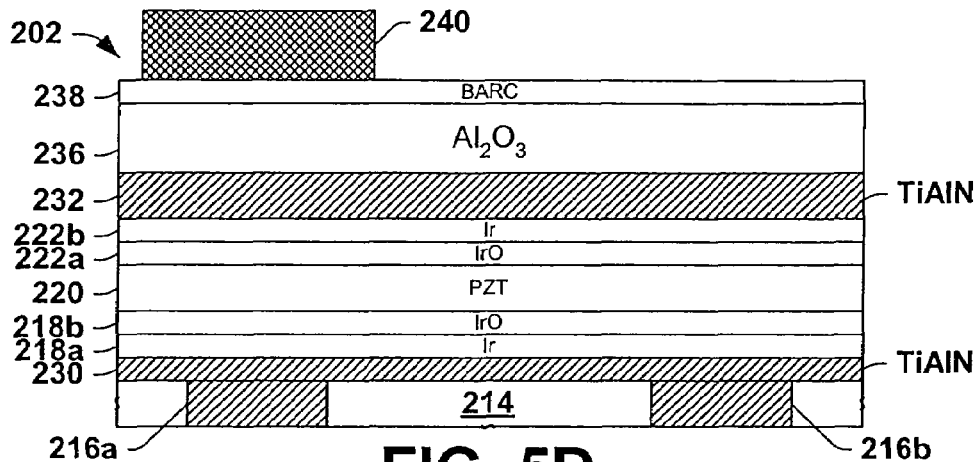
Figure 5E:
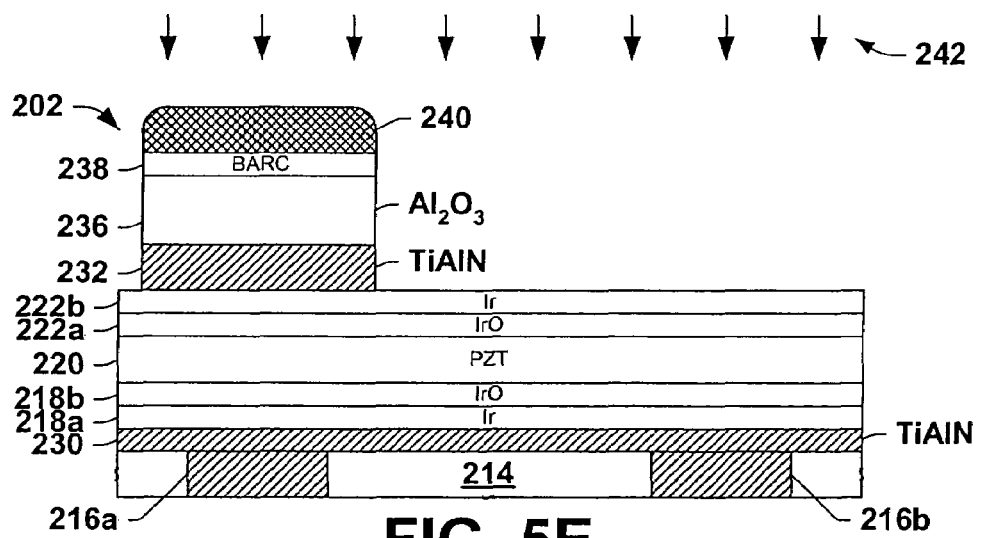
Figure 5F:

As illustrated in FIGS. 5D-5F, the ferroelectric capacitor material layers are then patterned using a mask 240 and etch processes 242 and 244. The capacitor stack mask 240 is formed in FIG. 5D using any suitable photolithographic techniques to cover a prospective capacitor stack portion of the BARC layer 238, leaving the remaining portions thereof exposed to the subsequent etching in FIGS. 5E and 5F. In FIG. 5E, an RIE hardmask etch process 242 is performed to pattern the hardmask layers 232 and 236, and the remaining mask and BARC materials 240 and 238 may then be removed by any suitable cleaning process. The patterned hardmask 232,236 is then used during a capacitor stack etch process 244 in FIG. 5F to define a capacitor stack $C_{FE}$, wherein some of the aluminum oxide 236 and TiAlN 232 may remain over the top of the capacitor stack $C_{FE}$, and wherein the sidewalls of the stack $C_{FE}$ are temporarily exposed.

Figure 5G:
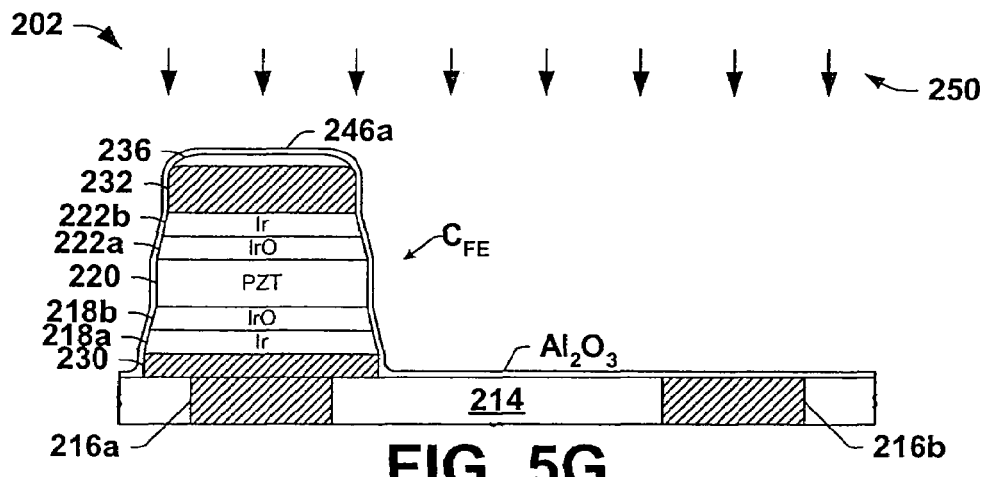
Figure 5H:
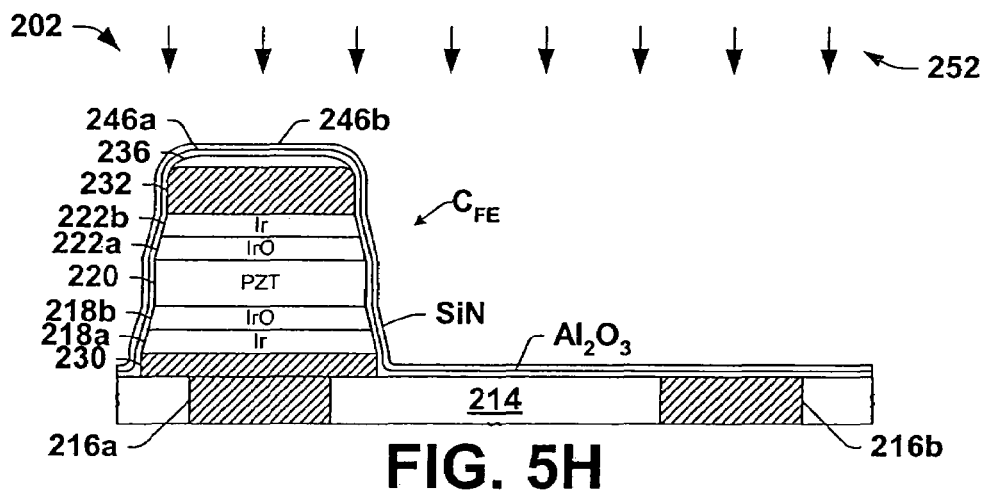

Thereafter in FIGS. 5G and 5H, a multilayer hydrogen barrier 246 is then formed above the ferroelectric capacitors $C_{FE}$, wherein a deposition process 250 is employed in FIG. 5G to form an aluminum oxide first hydrogen barrier layer 246a to any suitable thickness. The first barrier layer 246a may alternatively be any other material that does not react with the ferroelectric material 220 of the capacitor $C_{FE}$. In one example, the process 250 is a PVD process providing the aluminum oxide layer 246a having a thickness of about 400 Å. In another possible implementation, an ALD process 212 is used to deposit the layer 246a to a thickness of about 100 Å. In FIG. 5H, a silicon nitride (SiN) second hydrogen barrier layer 246b is formed over the aluminum oxide layer 246a using a PECVD or other deposition process 252, where the layer 246b operates as both a hydrogen barrier and as an etch-stop layer in subsequent etch operations (FIG. 5J below).

Figure 5I:
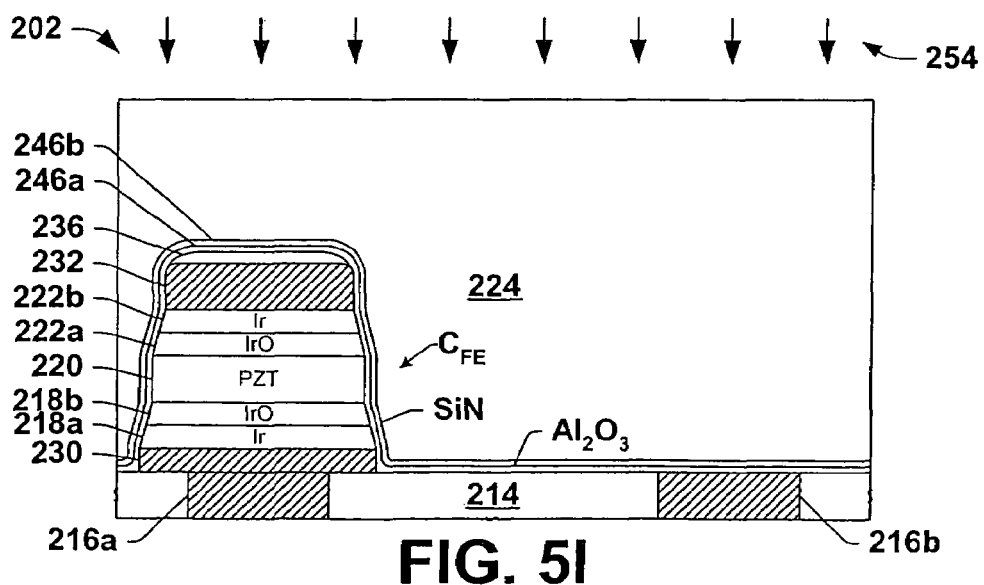
Figure 5J:
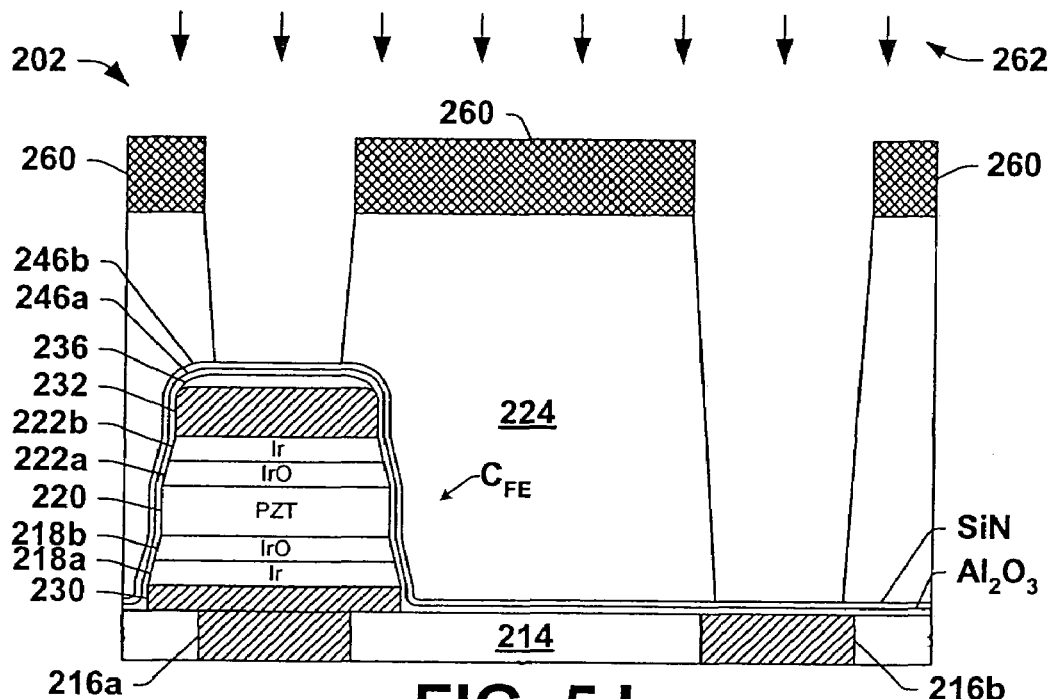

In FIG. 5I, a dielectric 224 (e.g., ILD0) is deposited over the hydrogen diffusion barrier 246 above the capacitor $C_{FE}$, the bitline contact 216b, and the PMD dielectric 214 via a deposition process 254. The ILD material 224 may be silicon dioxide ($SiO_2$), FSG, or other suitable dielectric. Conductive via structures 226 are formed in FIGS. 5J-5L through the ILD 224 to couple directly with the upper capacitor electrode 222 or through the remaining TiAlN 232, as well as to connect to the bitline contact 216b. In FIG. 5J, a mask 260 is formed and an etch process 262 is employed (e.g., VIA0 etch) to create openings through the ILD material 224 over the PMD bitline contact 216b and over the capacitor stack $C_{FE}$.

Figure 5K:
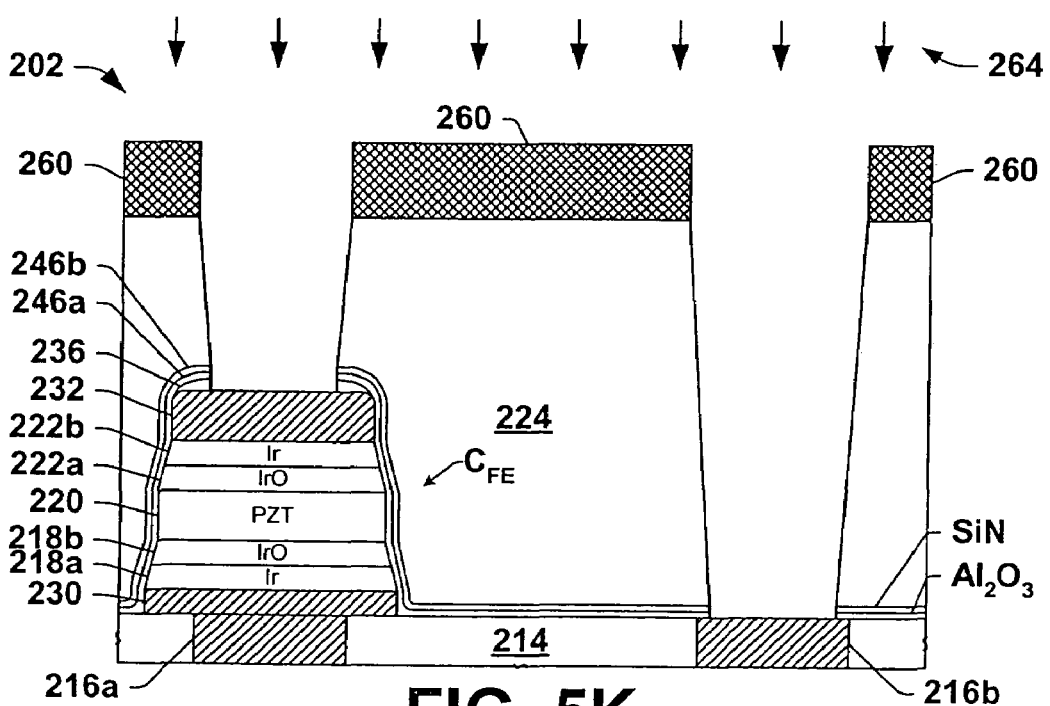
Figure 5L:
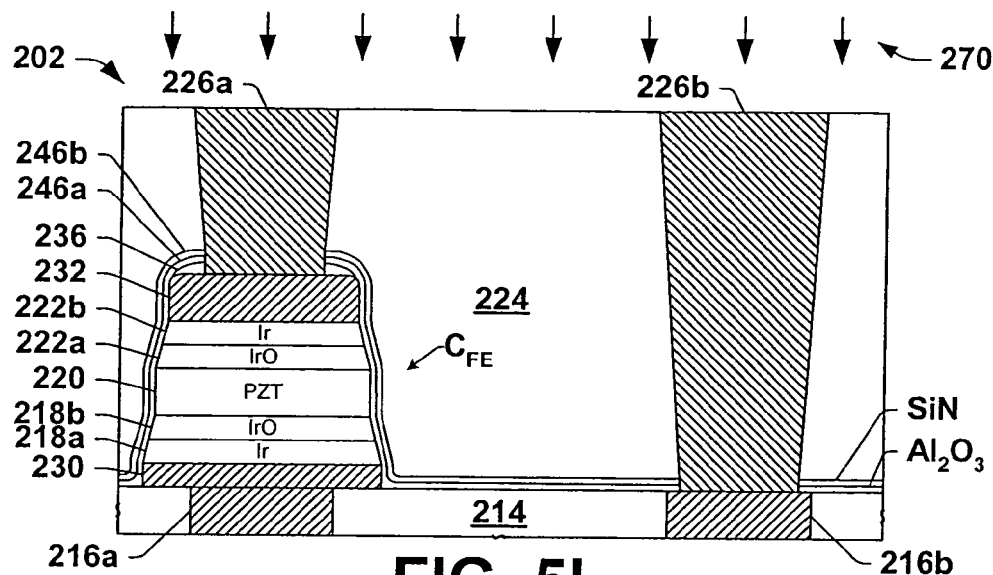
Figure 5M:
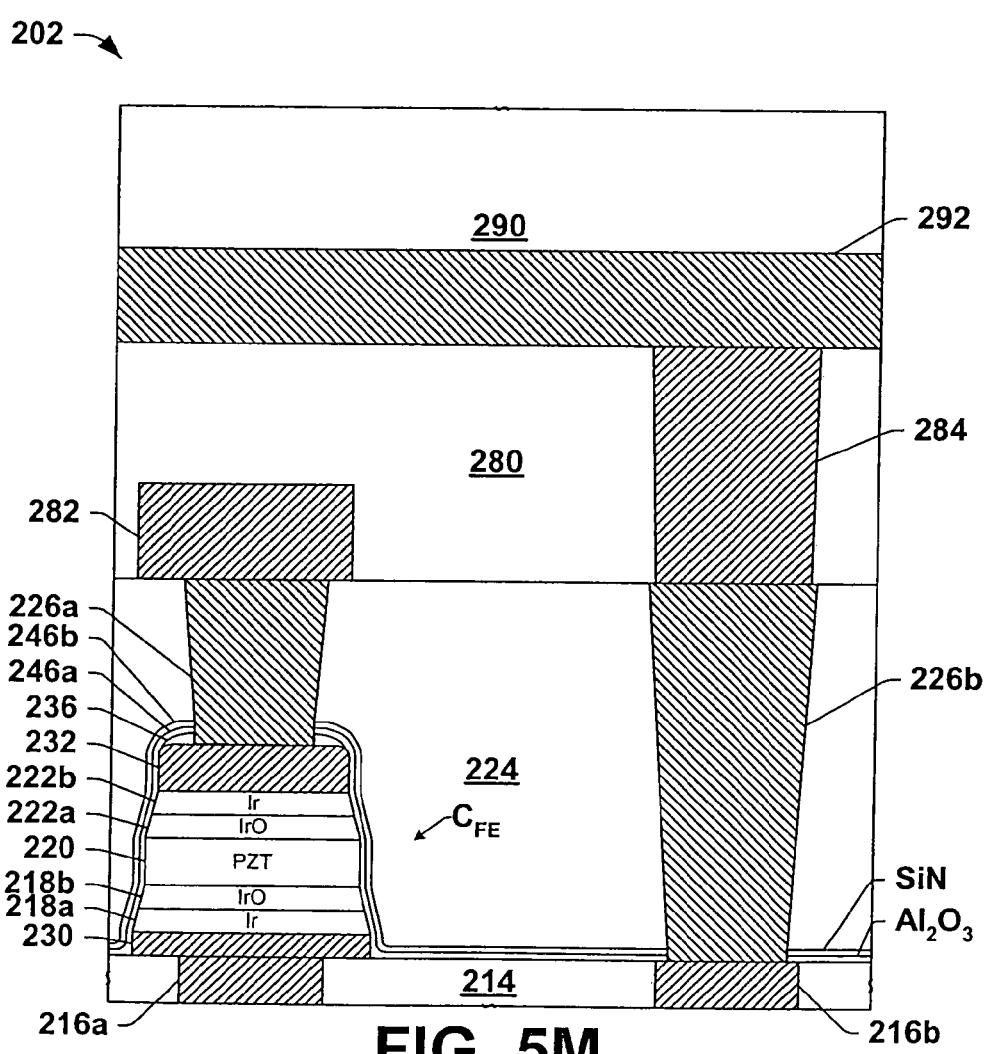

In FIG. 5K, another etch or cleaning operation 264 is performed to extend the VIA0 openings through the hydrogen diffusion barrier 246. In FIG. 5L conductive contacts or vias 226 are formed by filling the VIA0 openings with tungsten or other conductive material via a deposition process 270, wherein a VIA0 contact 226a (e.g., plateline ILD0 contact) couples to the capacitor $C_{FE}$ and another contact 226b couples with the PMD layer bitline contact 216b. Thereafter, further metalization levels can be formed, as shown in FIG. 5M, including another ILD material 280 (e.g., ILD1 level) with a conductive plateline routing structure 282 and an ILD1 bitline via 284, as well as an ILD2 dielectric 290 in which a conductive (e.g., copper) bitline routing structure 292 is formed.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A hardmask structure for forming a ferroelectric capacitor in a semiconductor device, comprising:
    a first hardmask layer disposed above an upper electrode material but not on lateral sidewalls of the ferroelectric capacitor, the first hardmask layer comprising a material containing titanium and aluminum, or chromium nitride;
    a second hardmask layer disposed above the first hardmask layer but not on the lateral sidewalls of the ferroelectric capacitor, the second hardmask layer comprising strontium tantalum oxide; and
    a third hardmask layer disposed above the second hardmask layer but not on the lateral sidewalls of the ferroelectric capacitor, the third hardmask layer comprising a material containing titanium and aluminum, or chromium nitride.

2. The hardmask structure of claim 1, wherein the ferroelectric capacitor comprises a lower electrode material overlying a semiconductor body, a ferroelectric dielectric material overlying the lower electrode material, and the upper electrode material overlying the ferroelectric dielectric material.

3. The hardmask structure of claim 2, wherein the lower electrode material and the upper electrode material are the same.

4. The hardmask structure of claim 2, wherein the ferroelectric dielectric material comprises lead zirconate titanate (PZT) or strontium bismuth tantalite (SBT).

5. A hardmask structure for forming a ferroelectric capacitor in a semiconductor device, comprising a strontium tantalum oxide material disposed above an upper electrode material but not on lateral sidewalls of the ferroelectric capacitor;
    wherein the strontium tantalum oxide material covers a first portion of the upper electrode material in a prospective ferroelectric capacitor region and exposes a remaining second portion of the upper electrode material for subsequent patterning of the upper electrode material for defining a capacitor stack portion of the ferroelectric capacitor.

6. The hardmask structure of claim 5, wherein the hardmask structure further comprises a material layer comprising titanium and aluminum, or chromium nitride interposed between the upper electrode material and the strontium tantalum oxide but not on the lateral sidewalls of the ferroelectric capacitor.

7. The hardmask structure of claim 6, wherein the hardmask structure further comprises a material layer comprising titanium and aluminum, or chromium nitride disposed over the strontium tantalum oxide but not on the lateral sidewalls of the ferroelectric capacitor.

8. The hardmask structure of claim 5, wherein the ferroelectric capacitor comprises a lower electrode material overlying a semiconductor body, a ferroelectric dielectric material overlying the lower electrode material, and the upper electrode material overlying the ferroelectric dielectric material.

9. The hardmask structure of claim 8, wherein the lower electrode material and the upper electrode material are the same.

10. The hardmask structure of claim 8, wherein the ferroelectric dielectric material comprises lead zirconate titanate (PZT) or strontium bismuth tantalite (SBT).

* * * * *